US012429621B1

United States Patent
Lin et al.

(10) Patent No.: US 12,429,621 B1
(45) Date of Patent: Sep. 30, 2025

(54) ADAPTIVE GAIN TRANSIENT ELECTROMAGNETIC RECEIVING SYSTEM BASED ON EXPONENTIAL PREDICTION AND METHOD THEREOF

(71) Applicant: Jilin University, Jilin (CN)

(72) Inventors: Tingting Lin, Jilin (CN); Qi Yu, Jilin (CN); Yu Song, Jilin (CN); Hualiang Wang, Jilin (CN); Zekai Liu, Jilin (CN)

(73) Assignee: Jilin University, Changchun (CN)

( * ) Notice: Subject to any disclaimer, the term of this patent is extended or adjusted under 35 U.S.C. 154(b) by 0 days.

(21) Appl. No.: 19/006,032

(22) Filed: Dec. 30, 2024

(30) Foreign Application Priority Data

Aug. 6, 2024 (CN) .......................... 202411068782.2

(51) Int. Cl.
*G01V 3/12* (2006.01)
*G01V 3/38* (2006.01)
*H03G 3/30* (2006.01)

(52) U.S. Cl.
CPC .................. *G01V 3/12* (2013.01); *G01V 3/38* (2013.01); *H03G 3/30* (2013.01)

(58) Field of Classification Search
CPC .............. G01V 3/12; G01V 3/38; H03G 3/30
See application file for complete search history.

(56) References Cited

U.S. PATENT DOCUMENTS

| 3,685,047 A * | 8/1972 | Sherer .................. H03G 3/3026 367/67 |
| 2008/0139152 A1* | 6/2008 | Kang ................... H03G 3/3052 455/234.1 |
| 2010/0332198 A1* | 12/2010 | Wahrmund .............. G01V 3/12 703/2 |

FOREIGN PATENT DOCUMENTS

| CN | 114978213 A | 8/2022 |
| CN | 116132420 A | 5/2023 |
| CN | 118191698 A | 6/2024 |

* cited by examiner

Primary Examiner — Judy Nguyen
Assistant Examiner — Adam S Clarke

(57) ABSTRACT

An adaptive gain transient electromagnetic receiving system based on exponential prediction and a method thereof are provided. The system includes a signal input unit, an amplification unit, a gain control unit, and a dual channel signal acquisition card. The signal input unit includes a receiving coil and a low-pass filter, and the amplification unit is a voltage controlled amplifier; the low-pass filter pre-processes the output signal of the receiving coil and divides the output signal into two signals. One is passed through a gain control unit, and the other enters into a voltage controlled amplifier. The A/D converter of the gain control unit converts the analog signal output by the low-pass filter into a digital signal, the FPGA module calculates the gain voltage, and the dual channel signal acquisition card collects the amplified signal and gain voltage simultaneously, which enhances the signal detection capability in deep regions.

6 Claims, 4 Drawing Sheets

ADAPTIVE GAIN TRANSIENT ELECTROMAGNETIC RECEIVING SYSTEM BASED ON EXPONENTIAL PREDICTION AND METHOD THEREOF

CROSS-REFERENCE TO RELATED APPLICATIONS

This application claims to the benefit of priority from Chinese Application No. 202411068782.2 with a filing date of Aug. 6, 2024. The content of the aforementioned applications, including any intervening amendments thereto, are incorporated herein by reference.

TECHNICAL FIELD

The present disclosure relates to the technical field of transient electromagnetic detection, in particular to an adaptive gain transient electromagnetic receiving system based on exponential prediction and a method thereof.

BACKGROUND

With the increasing demand for mineral resources in human society, transient electromagnetic method, as a rapidly developing electrical prospecting technology, has become increasingly widespread and important in the geological prospecting field. The transient electromagnetic method, also known as time domain electromagnetic method, relies on utilizing the ungrounded return wire or grounded return wire to transmit a pulsed magnetic field toward the underground. In this process, the uneven conductor in the underground will cause the generation of secondary field and form an anomalous field. During the intermittent phase of once pulsed magnetic field, the current further affects and excites the secondary magnetic field, which does not rapidly disappear due to the disappearance of the primary field. On the contrary, it exhibits a gradual attenuation process over time. In order to capture and analyze the information during this attenuation process, it is necessary to observe the secondary magnetic field using grounding electrodes or coils. Through these observational data, the law of the secondary magnetic field with time can be deeply understood and analyzed, so as to accurately judge the electrical structure and space conformation of the underground conductor.

In transient electromagnetic detection, the secondary field signals induced by different geological information exhibit distinct characteristics. In the early stage of detection, the signal amplitude is extremely high and can reach the order of $1 \times 10^1$ V. However, in the late stage, the signal amplitude sharply decreases, only reaching the order of $1 \times 10^{-5}$ V. In addition, the attenuation rates of secondary field signals corresponding to different geological structures are completely different. In order to capture these weak but crucial information, amplification systems are often used in practical applications to enhance signal strength and improve instrument signal resolution. Traditional TEM instruments mainly use fixed gain technology. However, this method has obvious limitations and cannot simultaneously consider signals from all time periods. In the case of high gain, early strong signals may exceed the detection range, resulting in the loss of shallow information. On the contrary, when the gain is set low, weak signals in the late stage are difficult to distinguish due to insufficient signal strength, resulting in the omission of deep information.

In summary, in order to overcome the shortcomings of traditional methods, variable gain technology is particularly important. By adjusting the gain of the amplifier in real-time and accurately matching based on the actual strength of the signal, the detection capability, detection depth, and sensitivity of the signal can be improved.

Chinese patent CN106918844B discloses a signal detection device for instantaneous floating point amplification and a detection method thereof. The gain of the programmable amplifier is adjusted in real time through pre sampling values to optimize the output and restrain the amplifier saturation, thereby improving the dynamic range of the system and the relative accuracy of the A/D converter. However, the change in its gain is limited to jumping based on the integer power of 2, which to some extent limits the improvement of the signal's dynamic range. In addition, the spike noise generated during the encoding switching process has a negative impact on data interpretation.

Therefore, it is necessary to continue exploring more flexible and precise gain control technology, ensuring that the gain can be adjusted adaptively with the change of signal without introducing unnecessary noise interference, and further improve the application effect of transient electromagnetic method in mineral resource exploration.

SUMMARY

The technical problem to be solved by the present disclosure is to provide an adaptive gain transient electromagnetic receiving system based on exponential prediction, which improves the signal detection capability, sensitivity, and signal-to-noise ratio in deep areas, and solves the technical problem of the gain in traditional receiving systems cannot adaptively adjust and switch the amplification factor to introduce unnecessary noise.

Another aspect of the present disclosure further provides an adaptive gain transient electromagnetic receiving method based on exponential prediction.

The present disclosure is realized as follows:

An adaptive gain transient electromagnetic receiving system based on exponential prediction, including a signal input unit, an amplification unit, a gain control unit, and a dual channel signal acquisition card, wherein the signal input unit includes a receiving coil and a low-pass filter connected to the receiving coil, and the amplification unit is a voltage controlled amplifier; the low-pass filter in the signal input unit pre-processes the output signal of the receiving coil and divides it into two signals, one of the two signals is used for amplitude prediction and gain control through the gain control unit, and the other of the two signals is connected to the voltage control amplifier for signal amplification, the gain control unit includes an A/D converter, a D/A converter, and an FPGA module, the A/D converter converts an analog signal output by the low-pass filter into a digital signal and inputs it to the FPGA module, the FPGA module uses exponential smoothing prediction method to calculate a gain voltage $V_G$ and inputs it to a voltage control port of the voltage control amplifier, realizing real-time adjustment of the gain of the voltage control amplifier with the change of the gain voltage $V_G$; the dual channel signal acquisition card simultaneously collects an amplified signal from the voltage controlled amplifier and the gain voltage $V_G$ output from the gain control unit;

Further, the voltage controlled amplifier adjusts a gain according to the gain voltage $V_G$ output by the gain control unit, a gain adjustment formula is G(dB)=40×$V_G$+20 dB when $V_G$ changing within the range of −500 mV to 500 mV, G(dB) represents an adjusted gain, dB represents a logarithmic unit of the gain, the gain of the voltage controlled amplifier is adjusted at a rate of 40 d B/V, so that the receiving system automatically adjusts the gain according to a different attenuation rate signals corresponding to different geological layers.

Further, the FPGA module uses the exponential smoothing prediction method to calculate the gain voltage $V_G$, including: establishing an exponential smoothing prediction model, simplifying the exponential smoothing prediction model into a combination of a smoothing factor α and an initial predictive value $Y_0$, wherein α is a constant between 0 and 1, for each new time step, a predictive value $Y_{t+1}$ will be updated to $Y_{t+1}=\alpha \times Y_t + \alpha \times (1-\alpha) \times Y_{t-1} + \alpha \times (1-\alpha)^2 \times Y_{t-2}$ based on a current observed value and a previous observed value, where $Y_t$ represents an observed value at time t, $Y_{t-1}$ represents an observed value at time t−1, and $Y_t$−2 represents an observed value at time t−2.

Further, the FPGA module uses the exponential smoothing prediction model established to predict the amplitude of a next signal using historical signal data, and subtracts a predicted signal amplitude from a preset reference voltage to calculate the gain voltage $V_G$.

Further, the dual channel signal acquisition card restores a collected signal to an original input signal.

On the other hand, the present disclosure provides an adaptive gain transient electromagnetic receiving method based on exponential prediction, including:

Collecting an output signal of the receiving coil;

After pre-processing, the output signal of the receiving coil is divided into two signals, one of the two signals is used for amplitude prediction and gain control, and the other of the two signals is used for signal amplification, amplitude prediction, and gain control, including calculating the gain voltage $V_G$ using the exponential smoothing prediction method and inputting it to an other of the two signals to achieve real-time adjustment of the gain of the other of the two signals with changes in the gain voltage $V_G$;

Collecting the amplified signal and the gain voltage $V_G$ simultaneously;

Further, the gain adjustment formula is G(dB)=40×$V_G$+ 20 dB, when $V_G$ changing within the range of −500 mV to 500 mV, G(dB) represents an adjusted gain, dB represents a logarithmic unit of the gain, and the gain is adjusted at a rate of 40 d B/V, so that the receiving system automatically adjusts the gain according to a different attenuation rate signals corresponding to different geological layers.

Further, the gain voltage $V_G$ is calculated using the exponential smoothing prediction method, including:

Establishing an exponential smoothing prediction model simplifying the exponential smoothing prediction model into a combination of a smoothing factor α and an initial predictive value $Y_0$, where a is a constant between 0 and 1, for each new time step, the predictive value $Y_{t+1}$ will be updated to $Y_{t+1}=\alpha \times Y_t + \alpha \times (1-\alpha) \times Y_{t-1} + \alpha \times (1-\alpha)^2 \times Y_{t-2}$ based on the current observed value and the previous observed value, where $Y_t$ represents a observed value at time t, $Y_{t-1}$ represents a observed value at time t−1, and $Y_{t-2}$ represents a observed value at time t−2.

Further, the exponential smoothing prediction model established is used to predict an amplitude of a next signal using historical signal data, and a predicted signal amplitude is subtracted from a preset reference voltage to calculate the gain voltage $V_G$.

Further, the receiving method further includes restoring a signal collected to an original input signal.

Compared with the prior art, the advantageous effects of the present disclosure are as follows:

An adaptive gain transient electromagnetic receiving system based on exponential prediction and a method thereof provided by the present disclosure, which applies a voltage controlled amplifier combined with a signal prediction algorithm to the receiving system of transient electromagnetic detection, to adaptively adjust the gain in real-time to respond to changes in the input signal. This design significantly expands the dynamic range of the instrument, enabling the device to more accurately capture secondary field signals of different changing processes, improving detection depth and sensitivity. More importantly, the present disclosure adopts an exponential smoothing prediction method, which can accurately predict the trend of input signal changes and achieve rapid adjustment of gain signals. This fast response method avoids the lag of the gain signal, making the detection results more timely and accurate. In addition, by adaptively adjusting the gain signal, the present disclosure effectively avoids the impact of peak noise caused by switching amplification factors in existing methods, further improving the quality of the signal and the accuracy of detection.

DETAILED DESCRIPTION OF THE EMBODIMENTS

In order to make the purpose, technical solution, and advantages of the present disclosure clearer and more understandable, the following will provide further detailed explanations of the present disclosure in conjunction with the embodiments. It should be understood that the specific embodiments described herein are only used to explain the present disclosure and are not intended to limit the present disclosure.

Figure 1:
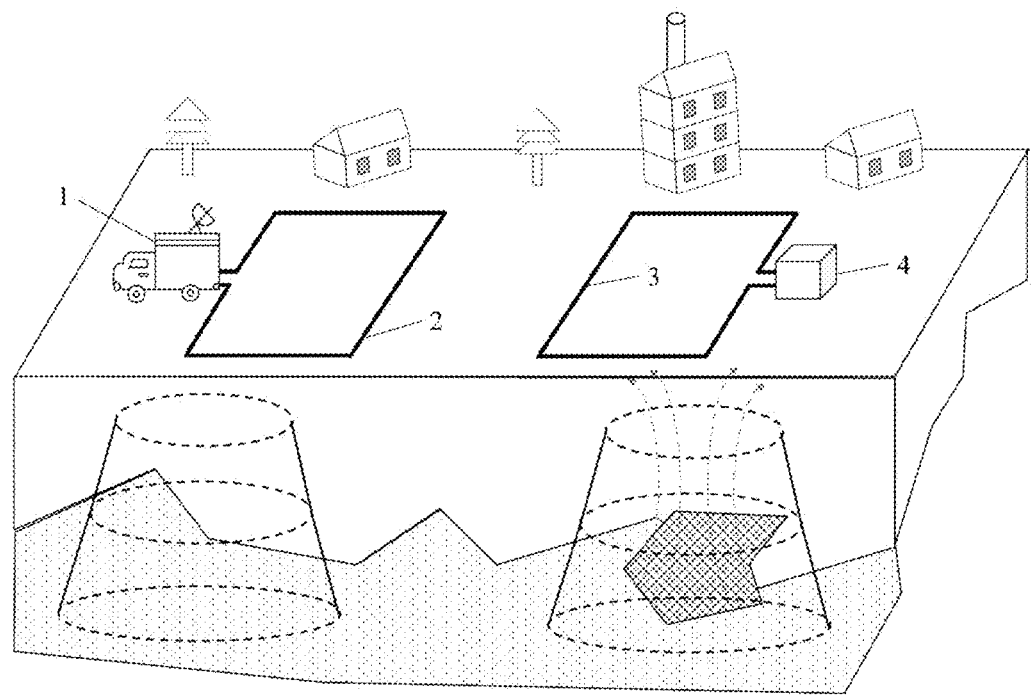
FIG. 1 is a schematic diagram of the operation of the transient electromagnetic detection system provided by an embodiment of the present disclosure.
Figure 2:
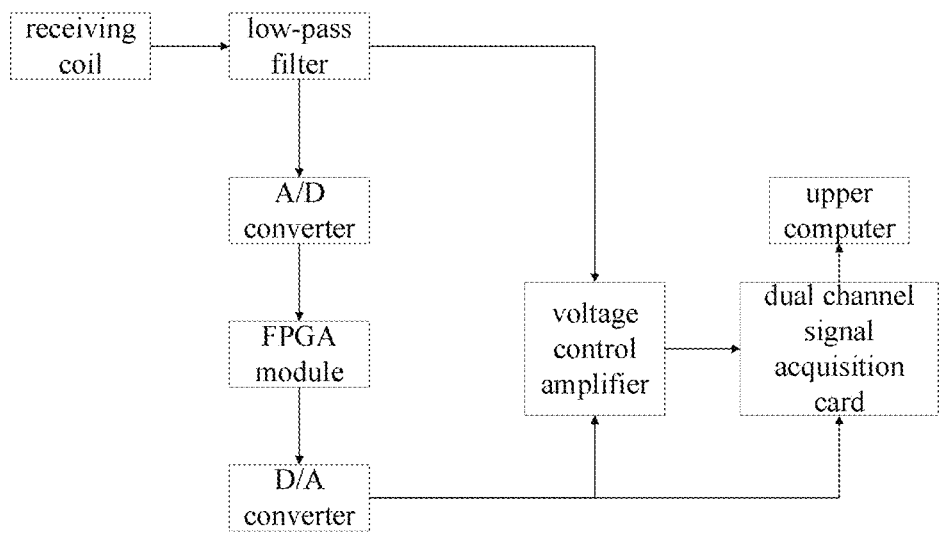
FIG. 2 is a structural block diagram of an adaptive gain transient electromagnetic receiving system based on exponential prediction provided by an embodiment of the present disclosure.

Referring to FIG. 1 and FIG. 2, one embodiment of the present disclosure provides an adaptive gain transient electromagnetic receiving system based on exponential prediction 4.

An adaptive gain transient electromagnetic receiving system based on exponential prediction 4, including a signal input unit, an amplification unit, a gain control unit, and a dual channel signal acquisition card. The signal input unit includes a receiving coil 3 and a low-pass filter connected to the receiving coil 3, and the amplification unit adopts a voltage controlled amplifier. The low-pass filter in the signal input unit preprocesses the output signal of the receiving coil 3 and divides the output signal into two signals. One of the two signals is used for amplitude prediction and gain control through a gain control unit, and the other of the two signals is connected to a voltage controlled amplifier for signal amplification. The gain control unit used includes an A/D converter, a D/A converter, and an FPGA module. The A/D converter converts the analog signal output by the low-pass filter into a digital signal and inputs the digital signal to the FPGA module. The FPGA module uses exponential smoothing prediction method to calculate the gain voltage $V_G$, and inputs it into the voltage control port of the voltage controlled amplifier, achieving real-time adjustment of the gain of the voltage controlled amplifier with the changes of the gain voltage $V_G$ in the voltage controlled amplifier. The dual channel signal acquisition card simultaneously collects the amplified signal from the voltage controlled amplifier and the gain voltage $V_G$ output from the gain control unit.

In this embodiment, the cut-off frequency of the low-pass filter is 150 kHz. The receiving coil 3 is connected to the input terminal of the low-pass filter, which filters out high-frequency noise and interference signals above 150 kHz, thereby preserving effective detection of underground secondary field signals. The signal processed by a low-pass filter retains key geological information while reducing noise interference, providing a good foundation for subsequent signal processing.

The voltage controlled amplifier adjusts its gain based on the gain voltage $V_G$ output by the gain control unit. The gain voltage $V_G$ is the difference between the signal amplitude predicted by the exponential smoothing algorithm and the preset reference voltage in the FPGA module. The gain adjustment formula G(dB)=40×$V_G$+20 dB used in the voltage controlled amplifier reflects the linear relationship between gain and gain voltage $V_G$. G(dB) represents the adjusted gain, and dB represents the logarithmic unit of gain. When changing within the range of −500 mV to 500 mV, the FPGA module in the gain control unit inputs the gain voltage $V_G$ to the voltage controlled amplifier, and the gain of the voltage controlled amplifier will be adjusted at a rate of 40 d B/V. This gain adjustment method enables the device to automatically adjust the gain according to the different attenuation rate signals corresponding to different geological layers, thereby effectively amplifying weak signals and compensating for the omission of deep geological information.

In the gain control unit, the A/D converter converts analog signals into digital signals and inputs the digital signals to the FPGA module. Due to the overall exponential attenuation trend of transient electromagnetic signals, the exponential smoothing prediction method is used to collect time series and corresponding amplitude data of the signals, and preprocess them to eliminate noise and outliers.

The FPGA module uses exponential smoothing prediction method to calculate the gain voltage $V_G$, which includes: establishing an exponential smoothing prediction model, assuming that recent observed value have a greater impact on the prediction than long-term observed value, simplifying the exponential smoothing prediction model into a combination of a smoothing factor α and an initial predictive value $Y_0$, where α is a constant between 0 and 1. For each new time step, the predictive value $Y_{t+1}$ will be updated to $Y_{t+1}=\alpha \times Y_t + \alpha \times (1-\alpha) \times Y_{t-1} + \alpha \times (1-\alpha)^2 \times Y_{t-2}$ based on the current observed value and the previous observed value, so as to find a balance between accurately tracking the signal change and maintaining the stability of prediction, where $Y_t$ represents the observed value at time t, $Y_{t-1}$ represents the observed value at time t−1, and $Y_{t-2}$ represents the observed value at time t−2. A smaller a value means that the exponential smoothing prediction model assigns greater weight to historical data, while a larger a value focuses more on recent data. If the time series data is relatively stable or the long-term trend change remains relatively stable, a smaller a value can be chosen. For example, select the a value between 0.05 and 0.2. If the time series data fluctuates greatly, the long-term trend changes significantly, or shows a clear and rapid upward or downward trend, a larger a value should usually be selected to increase the sensitivity of the exponential smoothing prediction model to recent data changes. For example, select the a value between 0.6 and 0.8. Due to the rapid attenuation of transient electromagnetic signals, the a value selected in this embodiment is 0.8.

The FPGA module can predict the amplitude of the next signal based on historical signal data, and subtract the predicted signal amplitude from the preset reference voltage to calculate the gain voltage $V_G$. After the gain voltage $V_G$ is converted into an analog signal by a D/A converter, it is input to the voltage control port of the voltage controlled amplifier to achieve real-time adjustment of the gain with changes in the gain voltage $V_G$.

In this embodiment, the dual channel signal acquisition card simultaneously collects amplified signals and gain control signals, providing complete data support for subsequent signal analysis and processing. The data collected the dual channel signal acquisition card is used to restore the original input signal using the inverse solution algorithm, accurately displaying the characteristics and laws of the underground secondary field signal, providing important basis for geological exploration and resource exploration.

Figure 3:
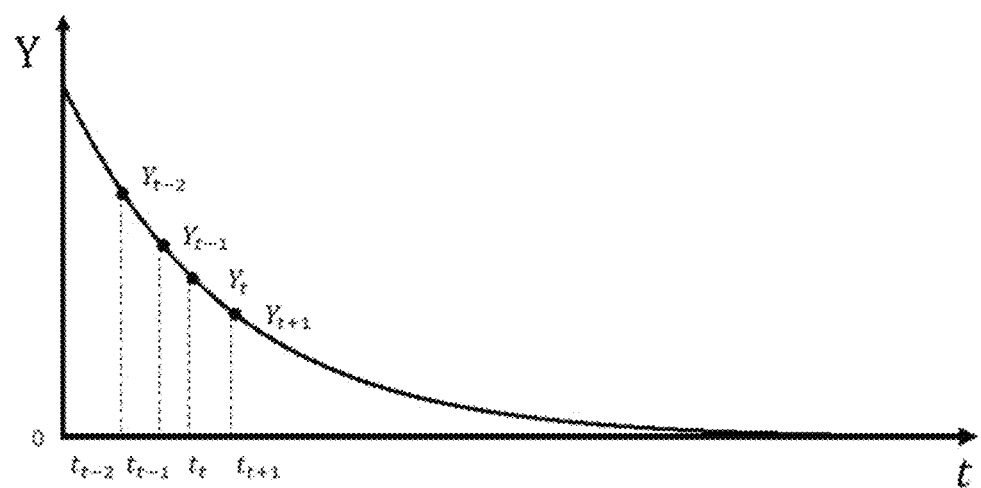
FIG. 3 is a schematic diagram of the exponential smoothing prediction method provided by an embodiment of the present disclosure.
Figure 4:
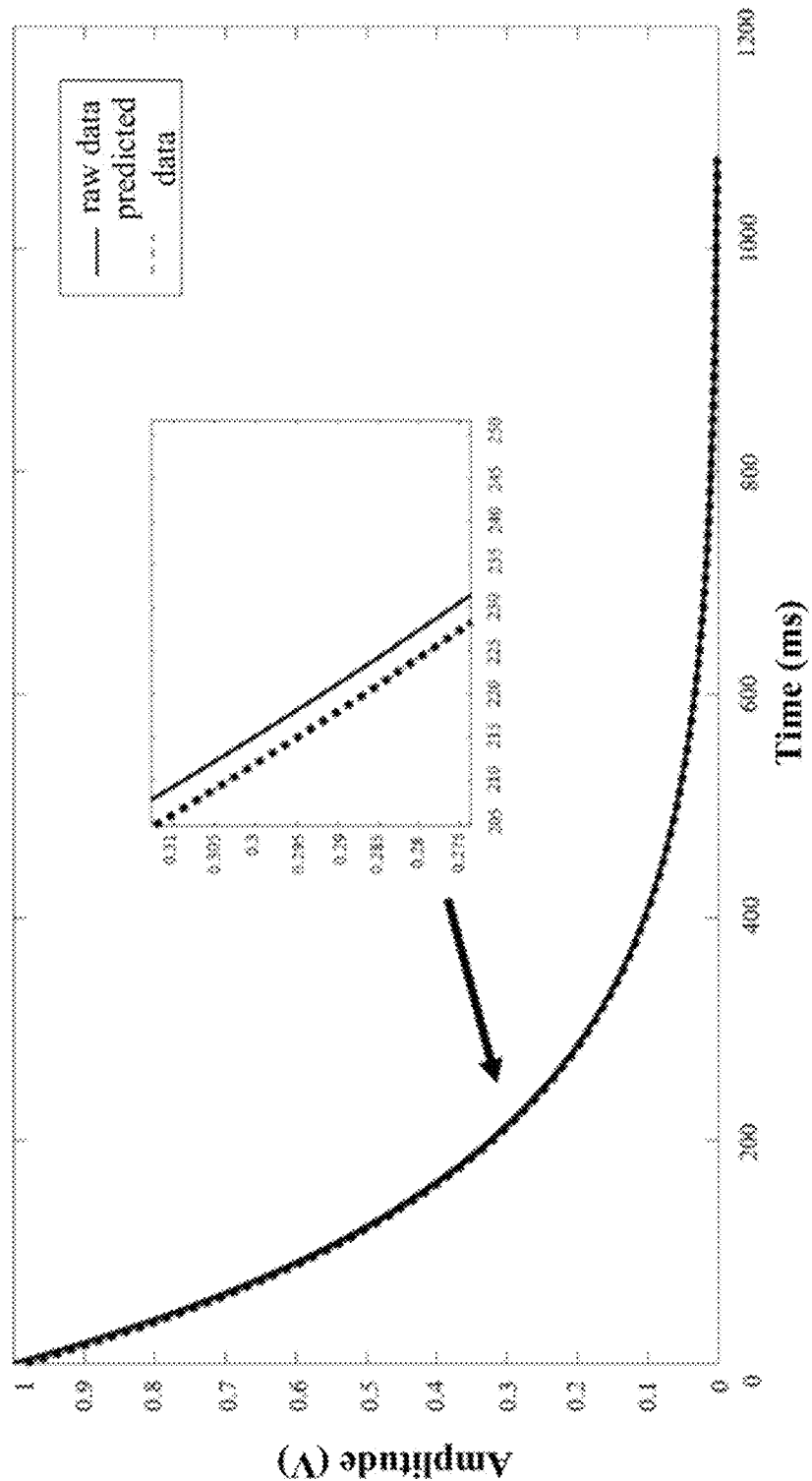
FIG. 4 is the prediction effect diagram of the exponential smoothing prediction method provided by an embodiment of the present disclosure.

When the adaptive gain transient electromagnetic receiving system based on exponential prediction 4 of the present disclosure is used for detection in a detection system, the first step is to deploy the transmitting coil 2 and the receiving coil 3. According to the detection target and terrain conditions, a suitable location is selected to deploy the receiving coil 3, ensuring that the receiving coil 3 is in close contact with the ground, reducing signal loss and interference. The transmitting coil 2 is carried by the transmitting power vehicle 1, and the receiving coil 3 is connected to the low-pass filter in the adaptive gain transient electromagnetic receiving system 4 based on exponential prediction of the present disclosure. The output port of the receiving coil 3 is connected to the input port of the low-pass filter, which is connected to the input port of the voltage controlled amplifier and the input port of the A/D converter respectively, and the A/D converter and the D/A converter are connected to the FPGA module respectively. The output of the D/A converter is divided into two signals, one of the two signals is connected to the gain control port of the voltage controlled amplifier, and the other of the two signals is simultaneously connected to the dual channel signal acquisition card with the output port of the voltage controlled amplifier. Meanwhile, the parameters of FPGA module is configured. During operation, the receiving coil 3 captures underground transient electromagnetic signals and sends them to a low-pass filter for pre-processing. The analog signal processed by the low-pass filter is divided into two signals, one of the two signals is directly sent to the voltage controlled amplifier, and the other of the two signals is sent to the A/D converter for analog-to-digital conversion. After the A/D converter converts the analog signal into a digital signal, the FPGA module starts working. The FPGA module reads the digital signal output by the A/D converter, as shown in FIG. 3, the amplitude of the next signal is predicted based on the exponential smoothing prediction method, taking three-point prediction as an example, according to the exponential smoothing prediction formula $Y_{t+1}=\alpha \times Y_t + \alpha \times (1-\alpha) \times Y_{t-1} + \alpha \times (1-\alpha)^2 \times Y_{t-2}$, where 0.8 is taken, the observed values $Y_{t-1}$, $Y_{t-2}$, and Y of the three sampling points collected by the A/D converter to predict the next sampling point, namely the predicted value $Y_{t+1}$, the prediction effect is shown in FIG. 4. Based on the characteristics of common transient electromagnetic signals, Matlab is used to simulate the input signal of the receiving coil 3, the raw data is shown by the solid line in FIG. 4, and the function formula is $V=0.1e^{-\beta t}$, where β is the attenuation coefficient of the simulate signal. The predicted data evaluated by the exponential smoothing formula is shown by the dashed line in FIG. 4. By calculation, the root mean square error between the original data and the predictive data is 0.0019, which meets the data collection requirements. Based on the predicted results, the FPGA module calculates the gain voltage. The D/A converter converts the gain voltage signal output by the FPGA module into an analog signal and connects it to the gain control port of the voltage controlled amplifier to adjust the gain in real time and amplify the input signal. The dual channel signal acquisition card simultaneously collects amplified signals and gain control signals, and uploads them to the upper computer to inverse solve the effective secondary field signals, finally obtaining the overall distribution of underground electrical structure.

Another embodiment of the present disclosure provides an adaptive gain transient electromagnetic receiving method based on exponential prediction, including:

Collecting the output signal of the receiving coil 3;

After pre-processing, the output signal of the receiving coil 3 is divided into two signals. One of the two signals is used for amplitude prediction and gain control, and the other of the two signals is used for signal amplification, amplitude prediction and gain control, including using exponential smoothing prediction method to calculate the gain voltage $V_G$, which is input to the other of the two signals to achieve real-time adjustment of the gain of the other of the two signals with the change of the gain voltage $V_G$;

Collecting the amplified signal and the gain voltage $V_G$ simultaneously.

Specifically, the gain adjustment formula is G(dB)=40× $V_G$+20 dB, when changing within the range of −500 mV to 500 mV, G(dB) represents the adjusted gain, dB represents the logarithmic unit of gain, and the gain is adjusted at a rate of 40 d B/V, so that the receiving system automatically adjusts the gain according to the different attenuation rate signals corresponding to different geological layers.

Specifically, using the exponential smoothing prediction method to calculate the gain voltage $V_G$ includes:

An exponential smoothing prediction model is established, which is simplified as a combination of a smoothing factor α and an initial predictive value $Y_0$, where α is a constant between 0 and 1. For each new time step, the predictive value $Y_{t+1}$ will be updated to: $Y_{t+1}=\alpha \times Y_t + \alpha \times (1-\alpha) \times Y_{t-1} + \alpha \times (1-\alpha)^2 \times Y_{t-2}$ according to the current observed value and previous observed value, where $Y_t$ represents the observed value at time t, $Y_{t-1}$ represents the observed value at time t−1 and $Y_{t-2}$ represents the observed value at time t−2.

Specifically, the established exponential smoothing prediction model is used to predict the amplitude of the next signal using historical signal data, and the predicted signal amplitude is subtracted from the preset reference voltage to calculate the gain voltage $V_G$.

The receiving method further includes restoring the collected signal to the original input signal.

Another embodiment provides an experiment conducted in a laboratory environment by the system of the present disclosure to verify the effectiveness.

Firstly, the system is initialized, and the FPGA module parameters are configured, including the parameters of exponential smoothing prediction method, the sampling rates of the A/D converter and the D/A converter. Based on the characteristics of common transient electromagnetic signals, Matlab is used to simulate the input signal of the receiving coil 3. The function formula is $V=0.1e^{-\beta t}$, where β is the attenuation coefficient of the simulate signal. The simulate input signal is input into the receiving system, processed by a low-pass filter to remove noise, and then divided into two signals. One of the two signals is input to the voltage controlled amplifier, and the other of the two signals is input to the FPGA module through an A/D converter. The trend of the input signal is predicted using exponential smoothing prediction method. After calculating the differential voltage, it is input to the gain control port of the voltage controlled amplifier to adjust the gain signal in real time with the changes of the input signal. Finally, the output signal of the voltage controlled amplifier and the amplified signal of the D/A converter are input to the dual channel information acquisition card for inverse solving of the original input signal.

Figure 5:
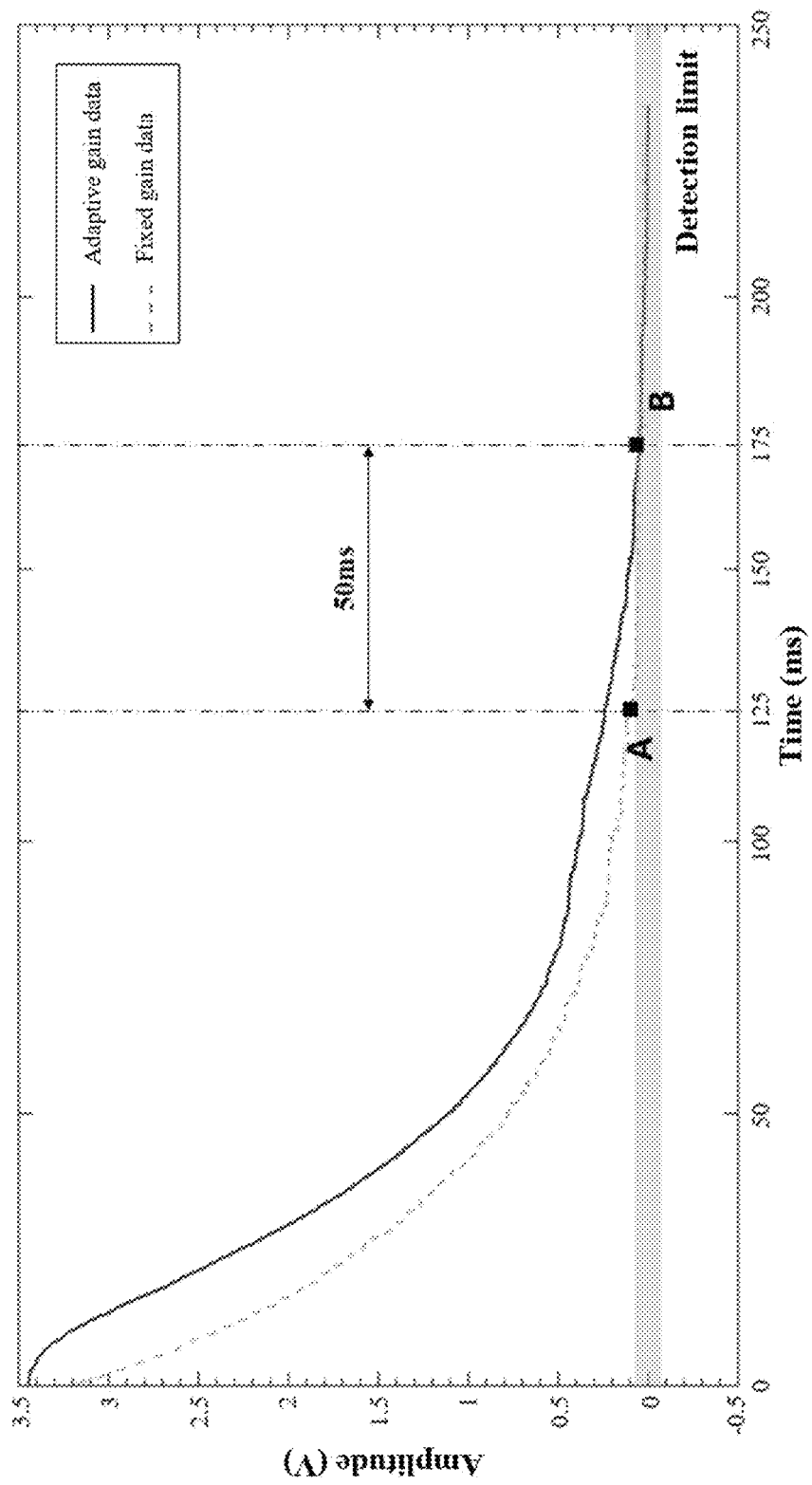
FIG. 5 is the comparison results between adaptive gain data and fixed gain data provided by an embodiment of the present disclosure.

As shown in FIG. 5, the adaptive gain data obtained by the method of the present disclosure is compared with the fixed gain data obtained by the traditional method, where the dashed line represents the fixed gain data collected by the traditional method, and the solid line represents the amplified adaptive gain data obtained by the present disclosure. The horizontal shaded line segment parallel to the time axis in FIG. 5 is the detection limit. Once the signal amplitude decays within this range, it cannot be effectively explained. From FIG. 5, it can be seen that traditional methods cannot adjust the gain in real-time based on the attenuation rate of the signal. Therefore, starting from point A, the fixed gain data signal has attenuated below the detection limit, the point A corresponding to 125 ms, resulting in the loss of deep signals after 125 ms. In contrast, the signal amplified by the system of the present disclosure only attenuates to the detection limit from point B onwards, which corresponds to 175 ms. The data after point B is considered invalid data. Therefore, compared with traditional methods, the present disclosure obtains an additional 50 ms of deep signals.

The above description is only a preferred embodiment of the present disclosure and is not intended to limit the present disclosure. Any modifications, equivalent substitutions, and improvements made within the spirit and principles of the present disclosure should be included within the scope of the present disclosure.

What is claimed is:

1. An adaptive gain transient electromagnetic receiving system based on exponential prediction, comprising a signal input unit, an amplification unit, a gain control unit, and a dual channel signal acquisition card, wherein the signal input unit comprises a receiving coil and a low-pass filter connected to the receiving coil, and the amplification unit is a voltage controlled amplifier; the low-pass filter in the signal input unit pre-processes an output signal of the receiving coil and divides the output signal of the receiving coil into two signals, one of the two signals is used for amplitude prediction and gain control through the gain control unit, and an other of the two signals enters into the voltage control amplifier for signal amplification; the gain control unit comprises an analog-to-digital converter, a digital-to-analog converter, and a field programmable gate array (FPGA) module, the analog-to-digital converter converts an analog signal output by the low-pass filter into a digital signal and inputs the digital signal to the FPGA module, the FPGA module uses exponential smoothing prediction method to calculate a gain voltage $V_G$ and input the gain voltage $V_G$ to a voltage control port of the voltage control amplifier, realizing real-time adjustment of a gain of the voltage control amplifier with changes of the gain voltage $V_G$; and the dual channel signal acquisition card simultaneously collects an amplified signal from the voltage controlled amplifier and the gain voltage $V_G$ output from the gain control unit;

the voltage controlled amplifier adjusts the gain according to the gain voltage $V_G$ output by the gain control unit, a gain adjustment formula is G(dB)=40×$V_G$+20 dB when $V_G$ changing within the range of −500 mV to 500 mV, G(dB) represents an adjusted gain, dB represents a logarithmic unit of the gain, the gain of the voltage controlled amplifier is adjusted at a rate of 40 d B/V, so that the receiving system automatically adjusts the gain according to a different attenuation rate signals corresponding to different geological layers wherein the FPGA module uses the exponential smoothing prediction method to calculate the gain voltage $V_G$, comprising: establishing an exponential smoothing prediction model, simplifying the exponential smoothing prediction model into a combination of a smoothing factor α and an initial predictive value $Y_0$, wherein α is a constant between 0 and 1; for each new time step, a predictive value $Y_{t+1}$ are updated to $Y_{t+1}=\alpha \times Y_t + \alpha \times (1-\alpha) \times Y_{t-1} + \alpha \times (1-\alpha)^2 \times Y_{t-2}$, based on a current observed value and a previous observed value, wherein $Y_t$ represents an observed value at time t, $Y_{t-1}$ represents an observed value at time t−1, and $Y_{t-2}$, represents an observed value at time t−2;

the FPGA module uses the exponential smoothing prediction model established to predict an signal amplitude of a next signal using historical signal data, and subtracts the signal amplitude predicted from a preset reference voltage to calculate the gain voltage $V_G$.

2. The adaptive gain transient electromagnetic receiving system based on exponential prediction according to claim 1, wherein the dual channel signal acquisition card restores a collected signal to an original input signal.

3. An adaptive gain transient electromagnetic receiving method based on exponential prediction, using the adaptive gain transient electromagnetic receiving system based on exponential prediction according to claim 1, comprising:

collecting the output signal of the receiving coil;

dividing the output signal of the receiving coil into two signals after pre-processing, one of the two signals is used for amplitude prediction and gain control, and the other of the two signals is used for signal amplification, wherein the amplitude prediction and the gain control comprises calculating the gain voltage $V_G$ using the exponential smoothing prediction method, and inputting the gain voltage $V_G$ to an other of the two signals to achieve real-time adjustment of the gain of the other of the two signals with the changes in the gain voltage $V_G$;

collecting the amplified signal and the gain voltage $V_G$ simultaneously;

the gain adjustment formula is G(dB)=40×$V_G$+20 dB, when $V_G$ changing within the range of −500 mV to 500 mV, G(dB) represents the adjusted gain, dB represents the logarithmic unit of the gain, and the gain is adjusted at the rate of 40 d B/V, so that the receiving system automatically adjusts the gain according to the different attenuation rate signals corresponding to different geological layers.

4. The adaptive gain transient electromagnetic receiving method based on exponential prediction according to claim 3, wherein the gain voltage $V_G$ is calculated using the exponential smoothing prediction method, comprising:

establishing an exponential smoothing prediction model, simplifying the exponential smoothing prediction model into a combination of a smoothing factor α and an initial predictive value $Y_0$, where a is a constant between 0 and 1, for each new time step, the predictive value $Y_{t+1}$ will be updated to $Y_{t+1}=\alpha \times Y_t + \alpha \times (1-\alpha) \times Y_{t-1} + \alpha \times (1-\alpha)^2 \times Y_{t-2}$ based on the current observed value and the previous observed value, wherein $Y_t$ represents a observed value at time t, $Y_{t-1}$ represents a observed value at time t−1, and $Y_{t-2}$ represents a observed value at time t−2.

5. The adaptive gain transient electromagnetic receiving method based on exponential prediction according to claim 4, wherein the exponential smoothing prediction model established is used to predict a signal amplitude of a next signal using historical signal data, and the signal amplitude predicted is subtracted from a preset reference voltage to calculate the gain voltage $V_G$.

6. The adaptive gain transient electromagnetic receiving method based on exponential prediction according to claim 3, wherein the receiving method further comprises restoring a collected signal to an original input signal.

* * * * *